United States Patent [19]
Jones et al.

[11] Patent Number: 5,265,329
[45] Date of Patent: Nov. 30, 1993

[54] FIBER-FILLED ELASTOMERIC CONNECTOR ATTACHMENT METHOD AND PRODUCT

[75] Inventors: Warren C. Jones, Winston-Salem, N.C.; John P. Redmond, Mechanicsburg, Pa.

[73] Assignee: AMP Incorporated, Harrisburg, Pa.

[21] Appl. No.: 713,930

[22] Filed: Jun. 12, 1991

[51] Int. Cl.⁵ .............................................. H01R 9/09
[52] U.S. Cl. ...................................... 29/832; 439/66; 439/91
[58] Field of Search ............... 439/66, 86, 91, 591; 174/259, 117 A; 361/400; 29/832, 834, 836

[56] References Cited

U.S. PATENT DOCUMENTS

| | | | |
|---|---|---|---|
| 3,794,953 | 2/1974 | Malin | 174/117 A |
| 4,209,481 | 6/1980 | Kashiro et al. | 29/877 |
| 4,449,774 | 3/1984 | Takashi et al. | 439/590 |
| 4,820,170 | 4/1989 | Redmond et al. | 439/66 |
| 4,918,814 | 4/1990 | Redmond et al. | 29/878 |
| 5,045,249 | 9/1991 | Jin et al. | 439/591 |
| 5,068,714 | 11/1991 | Seipler | 361/400 |
| 5,138,528 | 8/1992 | Altman et al. | 361/400 |

Primary Examiner—Neil Abrams
Attorney, Agent, or Firm—William B. Noll

[57] ABSTRACT

A method and product for providing an electrical interconnection between components and a substrate includes the use of an adhesive coating. The coating (40,42) is applied between the contacts (14,22) of component and substrate and the surface of a conductive fiber-filled, elastomeric connector (30) and is operable to bond the contacts to the surfaces of the connector with conductive fibers (34) of the connector piercing the adhesive coating to provide multiple contacts (36,38) and define current paths for the interconnection while mechanically bonding connectors, components, and substrate together. Protective covers (44) are applied to connectors to protect the adhesive coatings prior to use with sheets (50) or rolls (52) alternatively used to carry arrays of connectors in patterns corresponding to substrate contacts (14,22).

6 Claims, 5 Drawing Sheets

FIBER-FILLED ELASTOMERIC CONNECTOR ATTACHMENT METHOD AND PRODUCT

This invention relates to an elastomeric electrical connector used to interconnect electrical components to electrical circuits and to mount such components on substrates carrying such circuits.

BACKGROUND OF THE INVENTION

U.S. Pat. No. 4,820,170 granted Apr. 11, 1989 and drawn to a layered elastomeric connector and process for its manufacture, along with a related U.S. Pat. No. 4,918,814 issued Apr. 24, 1990 and drawn to a process for making a layered elastomeric connector teach a type of connector which is placed between the contacts of components and the contacts of boards such as printed circuit boards to effect an electrical interconnection therebetween. The elastomeric connectors theretaught are made of laminations of sheets of elastomeric insulating material such as silicon and sheets, or webs, of carbon fibers impregnated with elastomeric material such as silicon to form a sandwich of alternating conductive and insulating layers to result in a large number of discrete contact points and paths per unit of area resulting in a unique electrical interconnection. Upon compression of the lamination forming the connector, the various fibers are beam deflected to provide a residual force of contact between electrical contacts.

U.S. patent application Ser. No. 07/652,804 filed Feb. 12, 1991 is drawn to an electrical packaging system and components therefor and teaches a use of the laminated elastomeric connector disclosed in the above-mentioned Patents. Such use features the connector attached to circuits disposed on a substrate, such as the frame of a fluorescent fixture with various components such as connectors and fluorescent ballasts having contact pads pressed against the connector to interconnect such components to the circuit of use.

The present invention represents an improvement over the foregoing teachings and has, as an objective, a method of utilizing laminar elastomeric connectors having adhesive coated surfaces to interconnect components to substrates, both mechanically and electrically. A further object is to provide a fiber-filled elastomeric connector which, when compressed to effect electrical connection, results in a sealed connection due to an adhesive coating on the connector. The invention has the further object of providing a practical technique to mount, carry, and arrange adhesively coated laminar connectors for use with substrates having patterns of contacts to which components must be attached. The invention has as an object a connector article comprised of a laminar connector which is fiber-filled with conductive elements held in an insulating elastomeric medium with the ends of the connector and fibers coated with an adhesive of a thickness and characteristics to be readily penetrated upon compression of the connector to effect a sealed and mechanically and electrically reliable bond with the contacts of components and/or the contacts of substrates.

SUMMARY OF THE INVENTION

The present invention achieves the foregoing objectives through the provision of a method and product featuring a planar, laminar, elastomeric connector comprised of layers of insulating material bonded to layers of conductive elements, such as carbon fibers, with the ends of the conductive elements and the side surfaces of the connector coated with a thin layer of adhesive. Upon compression of the connector between the contacts of a component and a substrate, the ends of the conductive elements or fibers penetrate the adhesive and make contact with the contacts of such components and substrates, the elements deflecting resiliently and the adhesive bonding the connector to the contacts and to the surfaces adjacent such contacts of components and substrates. The adhesive layers flow under compression and facilitate penetration by the conductive elements to surround and seal the interfaces defined by such elements in bearing engagement with the contacts of components and substrates.

In accordance with one aspect of the invention, individual connectors coated with adhesives have thin flexible covers applied thereto to protective adhesives applied thereto during handling and assembly prior to use. In another embodiment, the sheet is made to contain numbers of connectors arranged in a pattern corresponding to the pattern of connector positions on a substrate with the sheet being applied to the substrate, peeled away to leave the connectors bonded to the substrate and the adhesives thereof open for interconnection to the contacts of components applied thereto in a subsequent step. The invention contemplates individual sheets containing patterns of connectors bonded to the sheet as well as rolls of sheets in patterns repeated in segments for the particular patterns of given substrates.

DETAILED DESCRIPTION OF PREFERRED EMBODIMENTS

Figure 1:
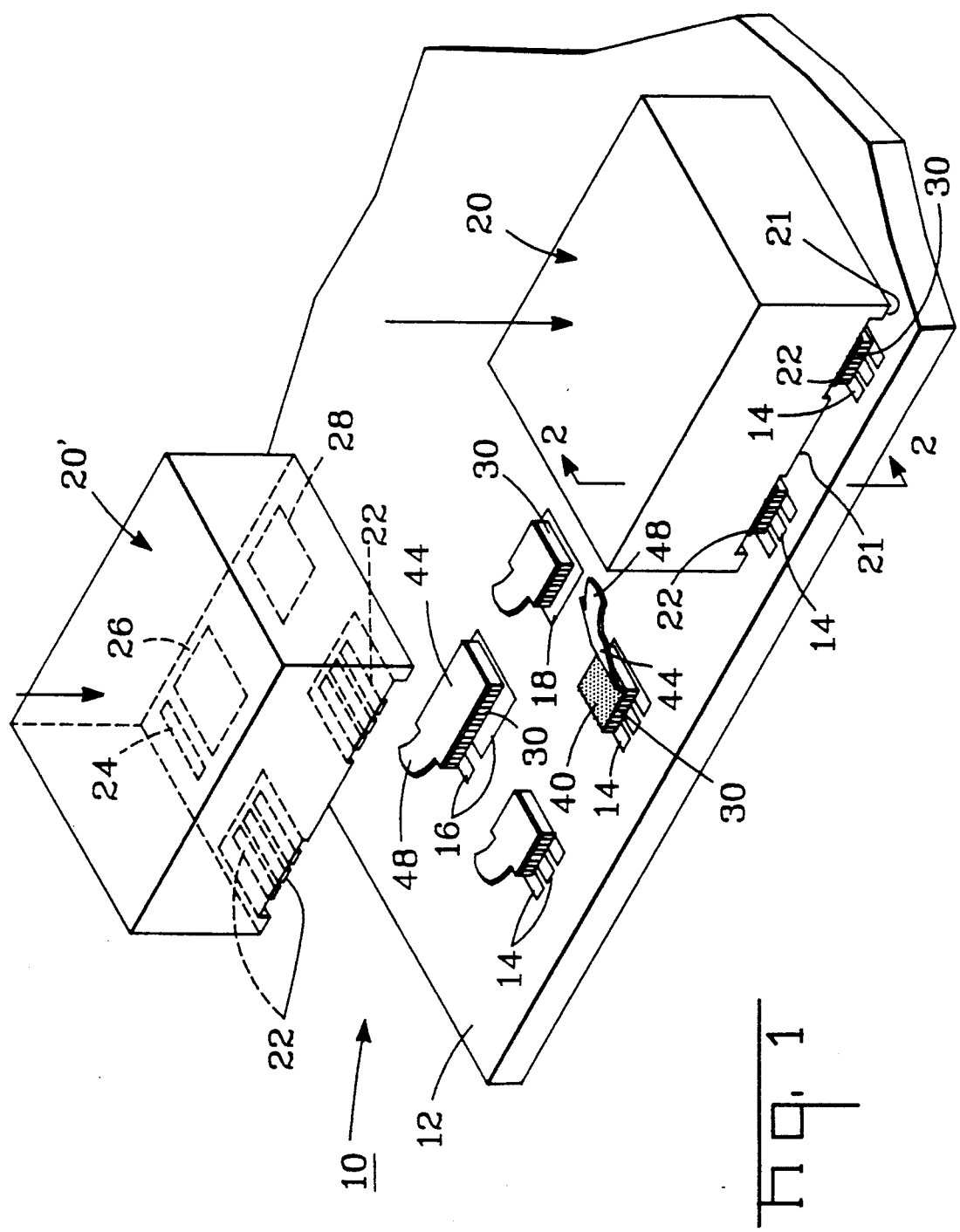
FIG. 1 is a perspective view showing a substrate and components with connectors and contacts in partial phantom preparatory and following attachment of components to the substrate.

Referring now to FIG. 1, an assembly 10 is shown to include a substrate 12 having one component 20 mounted to the upper surface thereof and a further component 20' positioned just above the upper surface of the substrate preparatory to mounting thereon. The substrate 12 may be considered to be a circuit board, such as a printed circuit board, having conductive traces therein which interconnect the various components to provide a system function as for example, for a computer, business machine, communication link, or the like. Alternatively, substrate 12 may be considered to be a structural component of a larger assembly having conductive wires or traces on the surface thereof which serves to mount and position components. In the embodiment of FIG. 1, the substrate 12 may be considered to include on the surface thereof a number of conductive pads 14 arrayed in a particular pattern related to both the positioning of components on the surface of 12 and interconnecting to conductive pads on such components. The conductive pads may be identical or different in accordance with the invention concept. Thus, with respect to FIG. 1, the lower row of pads 14 are in a pattern of three for each component contact area. In the second row, the contact pads 16 are two in number and a single contact pad 18 is shown with respect to a component contact area.

Figure 2:
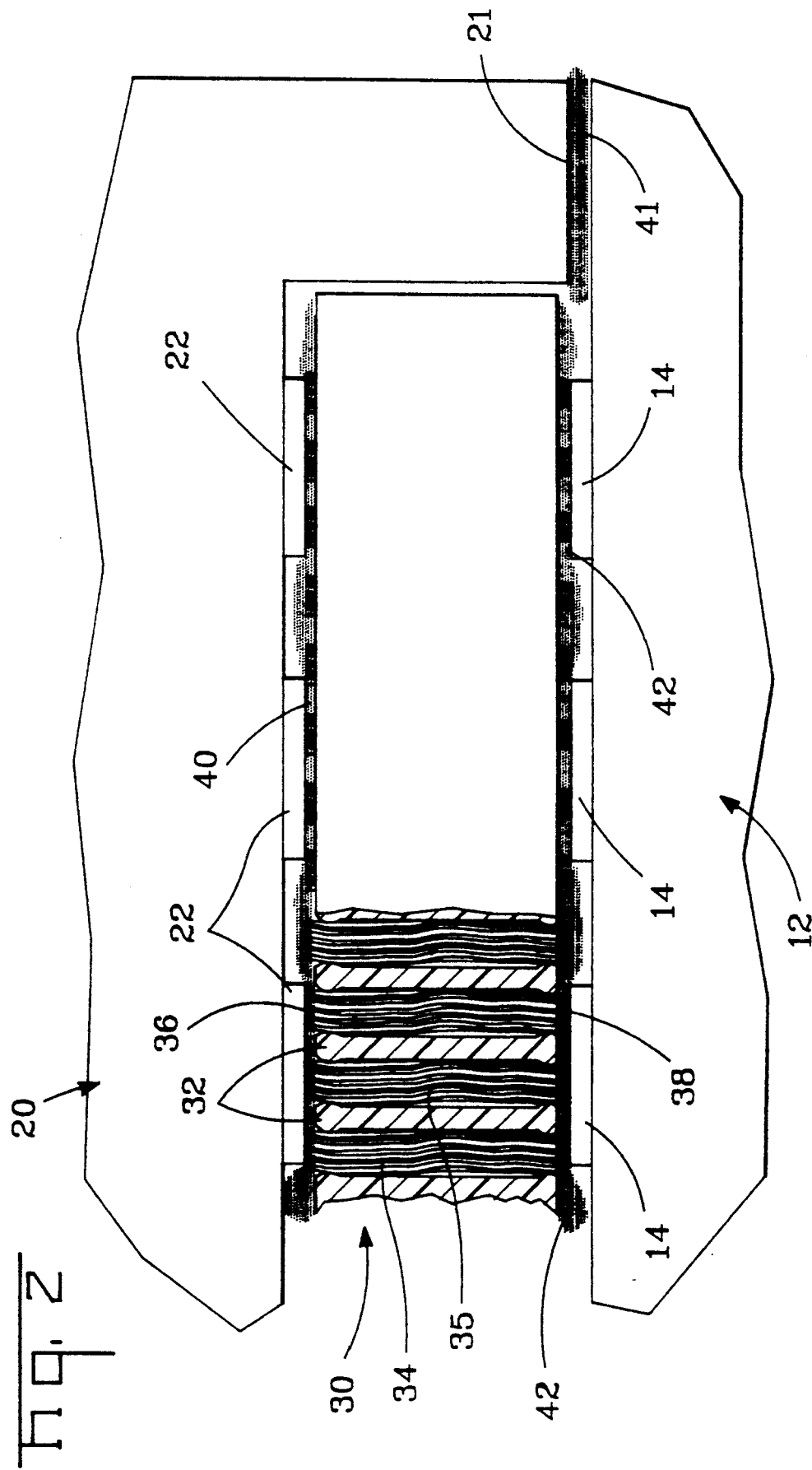
FIG. 2 is a partial sectional view taken through lines 2—2 of FIG. 1, considerably enlarged, showing an elevational and sectional detail of the connector of the invention interconnecting mechanically and electrically the contact pads of component and substrate.

The components 20,20' may be considered to be a wide range of elements including active and passive devices which contain electrical or electronic elements and define a given function. For example, the components 20,20' may be electrical switches, displays, connectors, discrete devices such as resistors, inductors, capacitors; or, components 20,20' may be integrated circuits containing a host of electronic devices interconnecting internally to provide system functions. The components 20,20' may be quite large or quite small, heavy or light in weight. Each of the components includes a lower flat surface 21 surrounding a series of contact pads on the undersurface thereof, the edges of contact pads 22 shown solidly with further portions of the pads shown in phantom with respect to the component 20' positioned above substrate 12. Also shown with respect to such component are pads 24, 26, and 28. It is to be noted that the various pads are positioned in a particular pattern with respect to each array of pads and have a particular area, all corresponding to the pads 14, 16, and 18 on the surface of 12. Thus, the forward pads 22 are three in number and coextensive in area with respect to pads 14 and pads 24, 26 are coextensive with pads 16 and pad 28 is singular and coextensive with pad 18. Also to be discerned in FIG. 1 is the presence of connectors 30 positioned on and covering the arrays of pads on substrate 12. The connectors 30 are, in the embodiment shown herein, are of the layered or lamina elastomeric type described in the U.S. Pat. Nos. '170 and '814 heretofore mentioned. The particular construction of such connectors is shown in FIG. 2 and in FIGS. 6 and 7 to include a lamination of elastomeric plastic 32 with a lamination of conductive elements embedded in an elastomeric plastic and shown as 34 in FIG. 2. The connectors 30 are made in the manner described in the heretofore mentioned patents by laminating thin layers of plastic sheet material forming the layers 32 with sheets of randomly oriented carbon fibers 35 which are then bonded to layer 32 and impregnated with a further plastic material. Typically, the layers 32 are of a silicon rubber elastomer on the order of 0.004 inches in thickness with the web of carbon fibers in one embodiment characterized as weighing one-half ounce per square yard. The carbon fibers are hard graphite on the order of 0.0003 inches in diameter and on the order of three-fourths of an inch in length. The web of fibers is impregnated with a silicon heat cured adhesive to result in the thickness of the layer 34 on the order of 0.005 inches so that each lamination 32, 34 is on the order of 0.009 to 0.0010 inches in thickness. These various layers are built up in sheet form which is subsequently stamped in a manner described by the patents to form the stack of sheets which is heat cured and thereafter sliced into connectors 30 transverse to the plane of the laminations. The resulting structure, the slices, may range in thickness from 0.020 up to 1 inch, the determining thickness dependent upon the particular application. The thinner the slice forming a connector 30, the less the resistance presented by the carbon fibers through the connector presented to current flowing through each of the carbon fibers. Conduction through the connector occurs by virtue of conduction through individual fibers 35 and the ends 36 and 38 thereof which are compressed in the manner shown in FIG. 2 to bite into the contact pads 14 and 22. Conduction also occurs by virtue of engagement with fiber ends 36 and 38 by different interior fibers which are in contact within the impregnated layer. The depth of the connector projection surface 21 limits compression of 30 as shown in FIG. 2.

Important to the invention is the elastomeric nature of each of the connectors 30 so that when compressed, the fibers are beam deflected to generate forces axially driving the ends 36 and 38 to engagement with the conductive pads. The elastomeric nature is dependent upon the compliance of the individual materials, the composite of fibers and silicon rubber, as well as the thickness of the different layers 32 and 34 and the overall thickness of the connector. The beam deflection or buckling of the fibers and the fibrous structure results in hundreds, if not thousands, of individual contact points 36 and 38 over a broad area of contact pad. In accordance with the invention, it has been discovered that the compression of a connector 30 can operate to drive the ends 36 and 38 axially outwardly to a degree to penetrate films and coatings of up to several thousandths of an inch. In accordance with the invention, the connector 30 is coated on at least one side and in the embodiment shown in FIGS. 2, 6, and 7, on both sides with a coating 40 on the upper surface and a coating 42 on the lower surface comprised of an adhesive material. A wide range of adhesives, from so-called rubber adhesives of the pressure sensitive type to, in some cases, epoxy adhesives, may be employed for the coatings or layers 40 and 42.

A further characteristic of the connector 30 is that, by virtue of the lamination, the connector is enabled to interconnect multiple pads, as for example the pads 14, with multiple pads, as for example the pads 22, through a single mechanical structure 30. This occurs by virtue of the isolation of the conductive fiber layers 34 across the width of the connector by the insulating layers 32.

In accordance with the invention, the adhesive layers 40 and 42 bond the connector 30 to the pads, such as 14 and 22, to thus bond a component to the substrate. Surfaces 21 on the component may be coated with adhesive 41 to bond to complementary surfaces on substrate 12 to hold the connectors compressed; the surfaces 21 being slightly less in thickness than the connectors. With respect to very small and light components, the adhesive on surfaces 21 and on connectors 30 may serve as the single means of attachment of component to substrate, particularly adhesives and particular areas of contact controlling the strength of bond between component and substrate.

In accordance with a further aspect of the invention, the coated layers 40 and 42 may be covered with a protective cover such as the covers 44 shown in FIGS.

Figure 6:
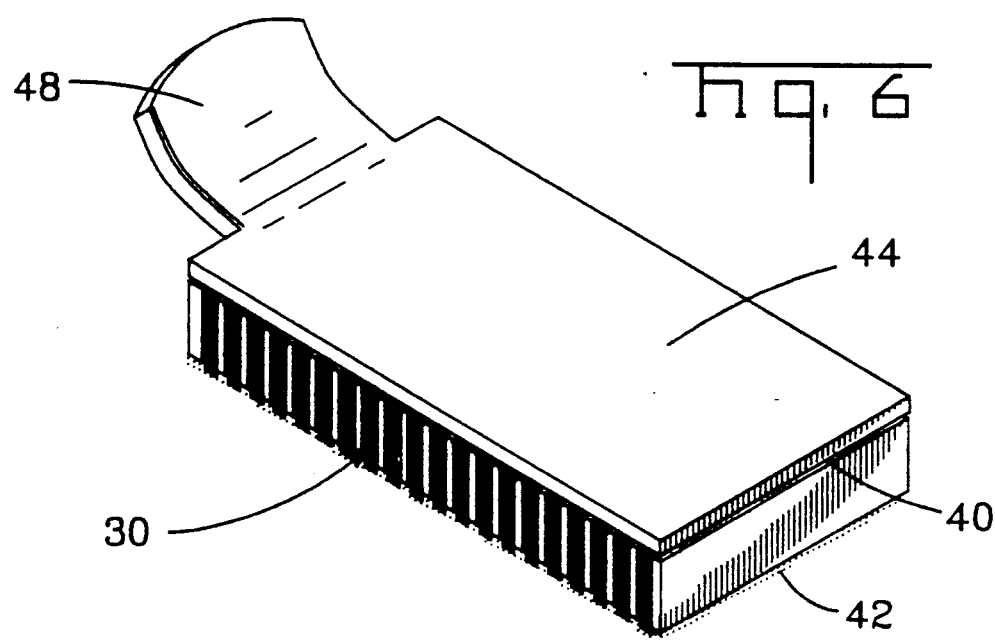
FIG. 6 is a perspective view, considerably enlarged, of the connector of the invention having a protective cover thereon.
Figure 7:
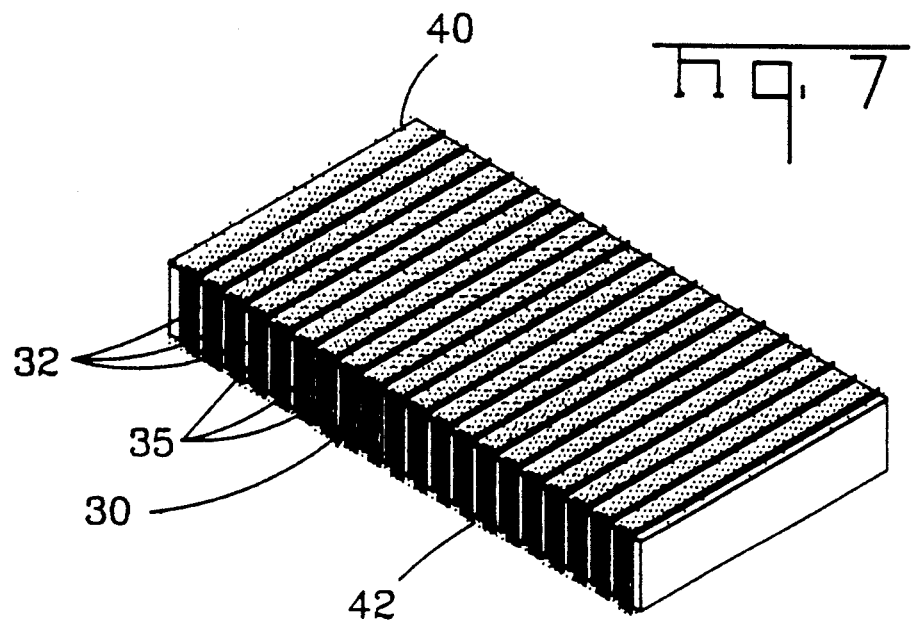
FIG. 7 is a perspective view of the connector of FIG. 6 having the protective cover removed therefrom.

1 and 6, applied to the upper surface of connectors 30. The covers 44 may include tabs 48 which allow the covers to be peeled from and removed from the connectors 30, one such cover being shown being removed in FIG. 1 with three covers in place. FIG. 6 also shows a cover on the upper surface of connector 30, and FIG. 7 shows the connector 30 with the cover removed to expose the layer 40. It is to be understood that the invention contemplates, in certain applications, having an adhesive layer on only one side of the connector, other adhesive coatings being applied to the mating surface and pads independently of a particular connector. For example, connectors 30 may be made to have covers 44 in the manner shown in FIG. 6 with no adhesive applied on the opposite surface, to correspond with layer 42 and with an equivalent adhesive layer being deposited on the surface of substrate 12 to be subsequently penetrated by the conductive elements 34, the ends 36 and 38 thereof upon application of the connectors and removal of the covers 44. Thus, in accordance with the invention in one embodiment, a substrate may have connectors 30 with their appropriate covers applied to the areas of contact pads in the particular patterns of pads on the substrate with components added at a later time by removal of the covers and positioning and alignment of the appropriate components which are then pressed down onto the substrate compressing the connectors and causing a penetration of the adhesive layers and an interconnection of the several pads of the component to the several pads of the substrate. Additionally it has been discovered that the adhesive, when compressed, flows to hold the component pads to the substrate pads with an electrical interconnection which is sealed by virtue of the adhesive having been penetrated to effectively surround each of the contact ends 36 and 38. A relatively light pressure held for short time will assure an excellent electrical interconnection. The pressure applied must be enough to compress the connector to effect the beam deflection of the fibers and penetration of the adhesive. Depending upon the type of adhesive used, pressure and/or heat may be also employed to cure the adhesive, the parameters of pressure, heat, and type of adhesive varying depending upon the thickness of the connector 30, the thickness of the coatings 40 and 42, and the overall size and characteristics of substrate and component as well as the area of surface 21 and engagement with surfaces of substrate 12.

Figure 3:
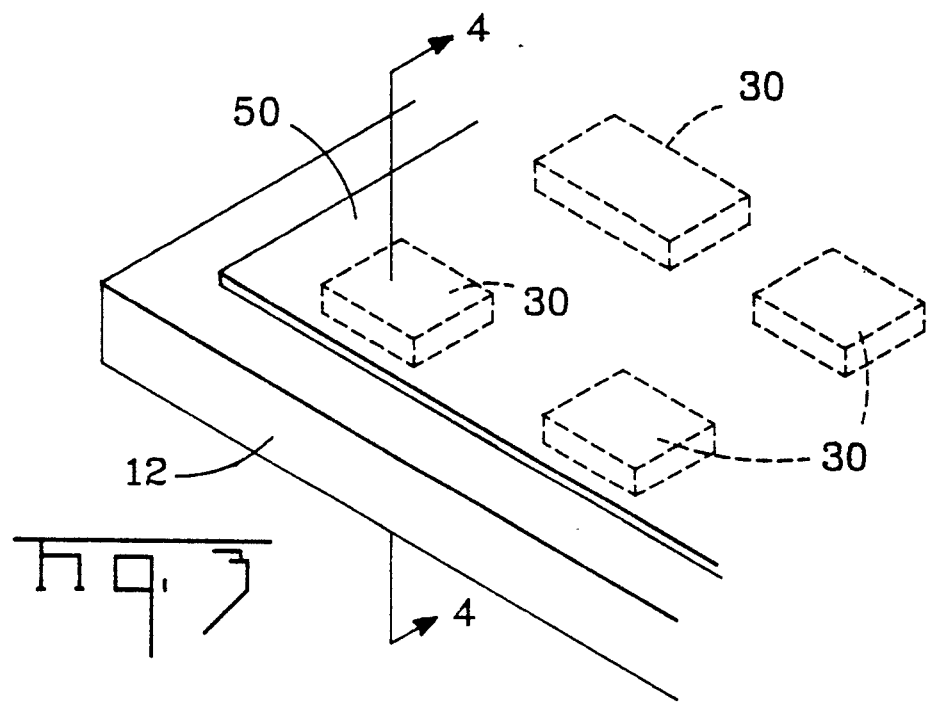
FIG. 3 is a perspective view of an alternative embodiment of the invention.
Figure 4:
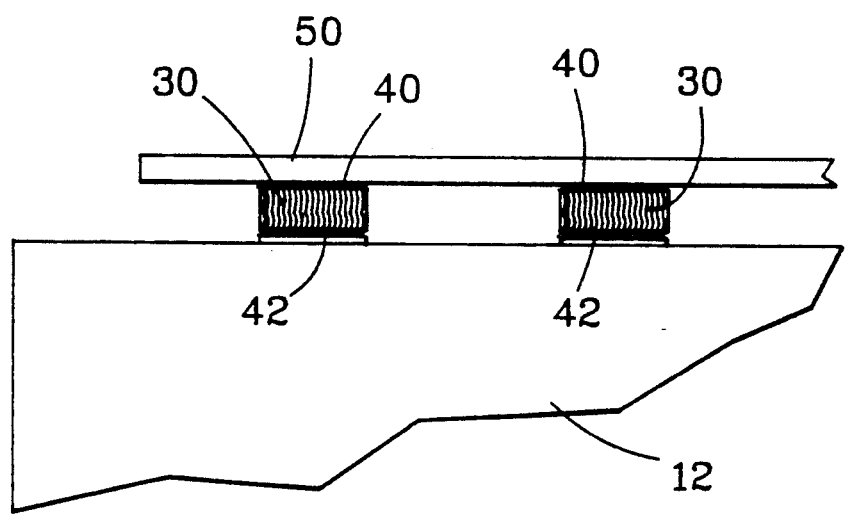
FIG. 4 is a sectional view taken through line 4—4 of FIG. 3.

Referring now to FIGS. 3 and 4, an alternative embodiment of the invention is shown wherein various connectors 30, arranged in a suitable pattern, are applied to a common cover 50 which may be formed of a sheet of plastic or paper, having surface characteristics to preclude a permanent bond of the pressure adhesive layers 40 and 42. Sheets of appropriate size relative tot he area of a given substrate 12 may thus have connectors mounted thereon with the sheets 50 stacked for assembly use. In such use, the sheets 50 may be positioned over the upper surface of the substrate, oriented to align the arrays of connectors 30, and then pressed downwardly to in essence deposit the connectors 30 onto the substrate, the layers 42 bonding the connectors to such substrate's upper surface. Thereafter, the sheet 50 may be removed as by peeling to expose the adhesive layers 40 with the various components being pressed into place on the substrate, interconnecting the various conductive pads in the manner heretofore described.

Figure 5:
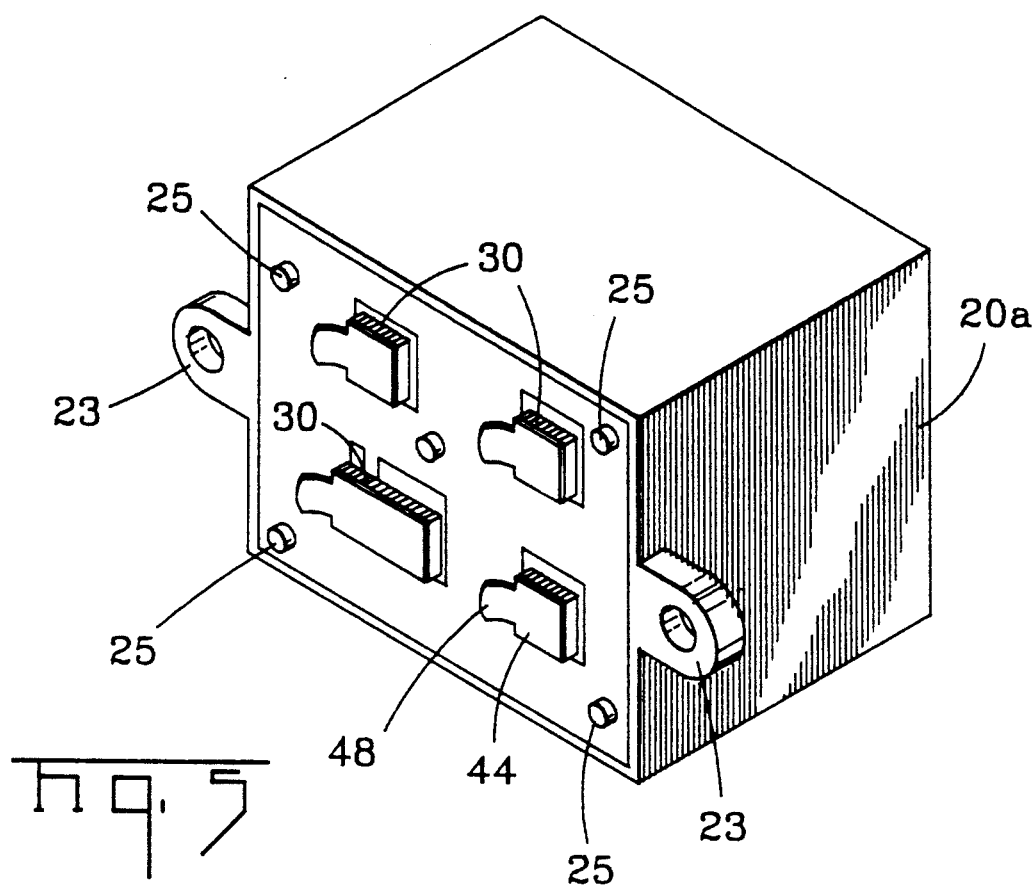
FIG. 5 is a perspective view showing the bottom of an alternative embodiment of a component that may be used herein.

FIG. 5 shows an alternative embodiment of the invention wherein a component 20a is made to have mounting rackets or feet 23 through which screws or other fasteners may be employed, to be engaged in complementary holes in a substrate 12 to mechanically lock the component 20a to the substrate. As can be seen in FIG. 5, the component 20a includes an array and pattern of connectors 30 having covers 44 thereon and in accordance with this embodiment, further includes a series of stand-off projections 25 which are of a length slightly less than the thickness of the connectors 30. In accordance with the embodiment of FIG. 5, a component 20a may be activated by removal of covers 44, positioned on a given substrate, and pressed downwardly, activating the connectors 44 to interconnect the pads of the substrate to the pads of the component. With the fasteners not shown applied through brackets 23 the component is held mechanically in place on the substrate with the connectors under compression, that compression being limited by engagement of the stand-off elements 25 with the upper surface of the substrate. The embodiment of FIG. 5 is preferred wherein very heavy or large components are applied to substrates; or, where the assembly 10 of substrate and components is subjected to rigorous mechanical stress in use. Employment of stand-off elements 25 preclude the application of fasteners overdriving the connectors or crushing the connectors to destroy the operation of the conductive elements and fibers.

Figure 8:
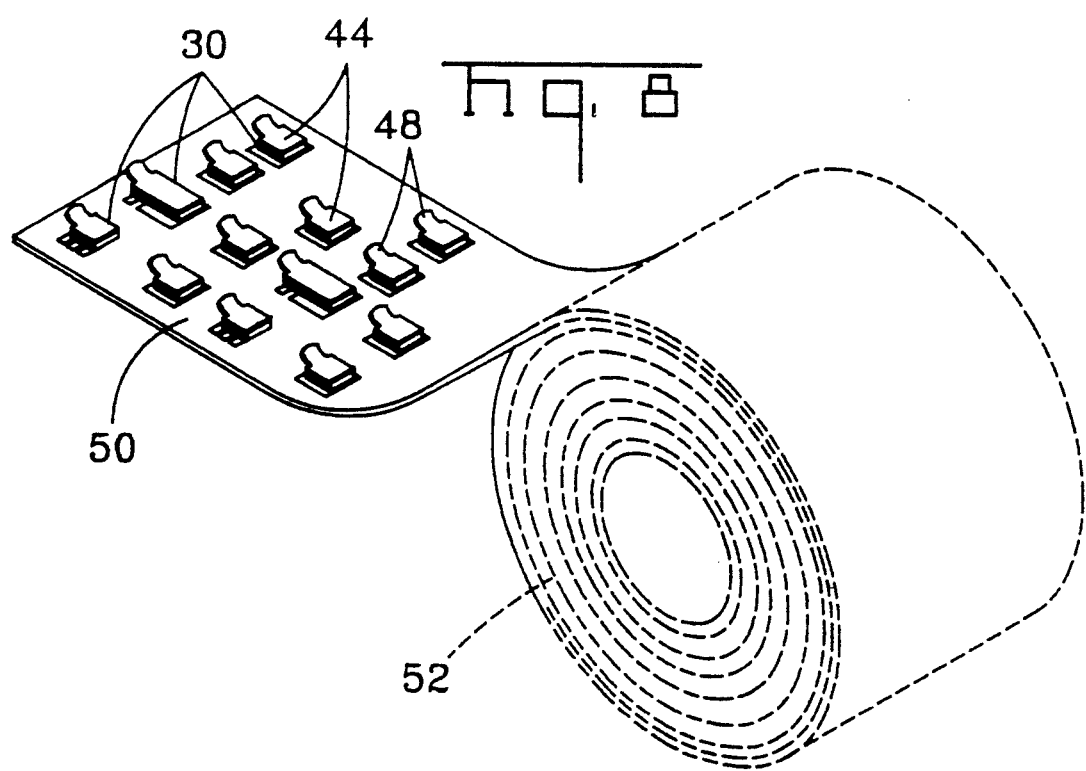
FIG. 8 is a perspective view showing a roll of sheet material, including segments having invention connectors arranged in patterns thereon in accordance with desired patterns of connectors to be mounted on a substrate.

FIG. 8 is an embodiment which shows the application of numerous components to a sheet 50 which is made in the form of a roll 52 to facilitate manufacture and assembly. The roll may include perforations to allow separation of sheet segments of 50.

The invention also contemplates alternative embodiments of the method and product of the invention to include coating the adhesive on components and covering the coated adhesive with a protective covering, coating the adhesive on substrates and similarly covering the coating with a protective covering, both procedures being utilized with an uncoated connector but with the connector functioning in compression to cause the contacts thereof to penetrate the adhesive coatings in the manner described. The invention also contemplates coating either or both the components and the substrate with adhesive just prior to the application of connectors without the use of sealing and protective covers, with the assembly of components, connectors, and substrates being made immediately and with the adhesive serving the purpose of binding the components and connectors to the substrate. Additionally, while the invention has shown the attachment of components to substrates in a single plane with respect to one-sided surfaces of the elements, the invention also contemplates interconnection of components to each other wherein contact pads disposed on the top of a component, for example, may be interconnected with a further or auxiliary component, in essence stacked upon the first component, utilizing the invention connector, adhesive concept. Laminations of substrates and components as a packaging concept is also contemplated, a plurality of substrates having a plurality of components therebetween, all interconnected by the invention laminar elastomeric connector and adhesive concept.

We claim:

1. A method for electrically interconnecting components to a substrate through the interconnection of contacts located on surfaces of the components and substrate comprising:

a. providing a connector to be positioned between a component and the substrate, aligned with the respective contacts thereof and characterized by having an elastomeric body including conductive elements contained therein with the ends thereof proximate the opposing surfaces of the connector to define conductive paths extending through the connector to join said ends, b. applying a thin coating of adhesive to extend between said opposing surfaces and the contacts of the component and a substrate, and c. pressing the component against the connector and substrate to engage the adhesive and bond the connector, component, and substrate together, and to compress the connector to drive the conductive elements to penetrate the adhesive on each opposing surface to engage element ends with a contact of the component and a contact of the substrate to interconnect one to the other with the adhesive sealing the end engagements of the conductive elements, wherein the said substrate has arrays of contacts in patterns on the surface thereof to be interconnected to multiple components with the connectors being mounted on a sheet of material in a manner to be readily removed therefrom and arranged in a pattern corresponding with the contacts of the substrate, the sheet being positioned to align connectors with contacts and apply such connectors to the substrate, the sheet being removed thereafter preparatory to application of components.

2. The method according to claim 1 wherein the step of applying adhesive includes applying adhesive to at least one opposing surface of the said connector.

3. The method according to claim 1 wherein the step of applying adhesive includes applying adhesive to both opposing surfaces of the connector.

4. The method according to claim 1 wherein the step of applying adhesive includes applying adhesive to the surfaces of a component.

5. The method according to claim 1 wherein the step of applying adhesive includes applying adhesive to surfaces of the substrate.

6. The method according to claim 1 including the further step of applying a protective cover between the adhesive and the contacts preliminarily to the removal of the cover prior to bonding of contacts and surfaces.

* * * * *